United States Patent
Decoutere et al.

(10) Patent No.: US 9,711,601 B2
(45) Date of Patent: Jul. 18, 2017

(54) SCHOTTKY DIODE STRUCTURE AND METHOD OF FABRICATION

(71) Applicant: IMEC, Leuven (BE)

(72) Inventors: Stefaan Decoutere, Leuven (BE); Nicolo Ronchi, Leuven (BE)

(73) Assignee: IMEC, Leuven (BE)

( * ) Notice: Subject to any disclaimer, the term of this patent is extended or adjusted under 35 U.S.C. 154(b) by 0 days.

(21) Appl. No.: 14/056,643

(22) Filed: Oct. 17, 2013

(65) Prior Publication Data

US 2014/0103357 A1 Apr. 17, 2014

(30) Foreign Application Priority Data

Oct. 17, 2012 (EP) ..................................... 12188867

(51) Int. Cl.
*H01L 29/417* (2006.01)
*H01L 29/872* (2006.01)
(Continued)

(52) U.S. Cl.
CPC ........ *H01L 29/417* (2013.01); *H01L 21/8252* (2013.01); *H01L 27/0605* (2013.01);
(Continued)

(58) Field of Classification Search
CPC . H01L 29/2003; H01L 29/402; H01L 29/417; H01L 29/66212; H01L 29/66219;
(Continued)

(56) References Cited

U.S. PATENT DOCUMENTS

2008/0217725 A1* 9/2008 Tu .................. H01L 29/0619
257/484
2008/0283870 A1 11/2008 Sato
(Continued)

OTHER PUBLICATIONS

Ye, P. D. and Yang, B. and Ng, K. K. and Bude, J. and Wilk, G. D. and Halder, S. and Hwang, J. C. M., "GaN metal-oxide-semiconductor high-electron-mobility-transistor with atomic layer deposited Al2O3 as gate dielectric," Applied Physics Letters, 86, 063501 (2005), DOI:http://dx.doi.org/10.1063/1.1861122.*
King et al., "Schottky Barrier Height at Dielectric Barrier/Cu Interface in low-k/Cu Interconnects," ECS Transactions, 35 (4) 849-860 (2011).*
European Search Report dated Mar. 19, 2013 for application EP 12188867.1.
(Continued)

*Primary Examiner* — Karen Kusumakar
(74) *Attorney, Agent, or Firm* — Knobbe, Martens, Olson & Bear LLP

(57) ABSTRACT

The disclosed technology relates to a device including a diode. In one aspect, the device includes a lower group III metal nitride layer and an upper group III metal nitride layer and a heterojunction formed therebetween, where the heterojunction extends horizontally and is configured to form a two-dimensional electron gas (2DEG) that is substantially confined in a vertical direction and within the lower group III metal nitride layer. The device additionally includes a cathode forming an ohmic contact with the upper group III metal nitride layer. The device additionally includes an anode, which includes a first portion that forms a Schottky barrier contact with the upper group III metal nitride layer, and a second portion that is separated vertically from the upper group III metal nitride layer by a layer of dielectric material. The anode is configured such that the second portion is horizontally located between the anode and the cathode and the dielectric material is configured to pinch off the 2DEG layer in a reverse biased configuration of the device. The device further includes a passivation area formed between the anode and the cathode to horizontally separate the anode and the cathode from each other.

2 Claims, 10 Drawing Sheets

(51) Int. Cl.
*H01L 29/66* (2006.01)
*H01L 29/778* (2006.01)
*H01L 29/20* (2006.01)
*H01L 21/8252* (2006.01)
*H01L 27/06* (2006.01)
*H01L 29/205* (2006.01)
*H01L 29/40* (2006.01)

(52) U.S. Cl.
CPC ...... *H01L 27/0629* (2013.01); *H01L 29/2003* (2013.01); *H01L 29/205* (2013.01); *H01L 29/66212* (2013.01); *H01L 29/66219* (2013.01); *H01L 29/7787* (2013.01); *H01L 29/872* (2013.01); *H01L 29/402* (2013.01)

(58) Field of Classification Search
CPC .. H01L 29/7787; H01L 29/872; H01L 29/408
See application file for complete search history.

(56) References Cited

U.S. PATENT DOCUMENTS

| | | | |
|---|---|---|---|
| 2010/0019279 A1* | 1/2010 | Chen et al. | 257/194 |
| 2010/0078683 A1* | 4/2010 | Baba | H01L 29/2003 257/192 |
| 2010/0207166 A1* | 8/2010 | Zhu | 257/201 |
| 2011/0133251 A1 | 6/2011 | He | |
| 2012/0223320 A1* | 9/2012 | Dora | 257/76 |

OTHER PUBLICATIONS

Lee et al, Suppression of Leakage Current of Ni/Au Schottky Barrier Diode Fabricated on AlGaN/GaN Heterostructure by Oxidation, Japanese Journal of Applied Physics, vol. 45, No. 4B, 2006, pp. 3398-3400.

* cited by examiner

SCHOTTKY DIODE STRUCTURE AND METHOD OF FABRICATION

CROSS-REFERENCE TO RELATED APPLICATIONS

This application claims foreign priority to European patent application EP 12188867.1 filed on Oct. 17, 2012, the contents of which is incorporated by reference herein in its entirety.

BACKGROUND OF THE INVENTION

Field of the Invention

The disclosed technology generally relates to semiconductor devices, and in relates particularly to devices comprising Schottky diodes having a junction between a metal and a group III metal nitride semiconductor.

Description of the Related Technology

Different types of diodes can be integrated in integrated circuit devices. Diodes are often categorized based on their types of junctions. For example, a diode can include a junction formed by a p-type semiconductor and an n-type semiconductor, in which case the diode is referred to as a PN diode. On the other hand, a diode can include a junction formed by a metal and an n-type or a p-type semiconductor, in which case the diode is referred to as a Schottky diode. Schottky diodes are widely used in rectifying circuits because of their relatively low forward voltage drop and fast switching characteristics. In particular, Schottky diodes produced on AlGaN/GaN heterostructures benefit from the high breakdown voltage of the GaN and the high mobility and high electron density of the 2DEG-layer (2-dimensional electron gas) appearing between the GaN and the AlGaN layer as a result of the difference of piezoelectric and spontaneous polarization. Such Schottky diodes, however, sometimes can have high leakage current when the diode is reverse-biased, which can result in an increased power loss for an electronic device. US Patent Application 2011/0133251 discloses a GaN/AlGaN based Schottky diode structure comprising a stack of a GaN layer and an AlGaN layer, with a metal anode on top of the AlGaN layer forming a Schottky contact therewith, and a metal cathode on the AlGaN layer forming an ohmic contact therewith. A field dielectric layer separates the anode and cathode electrically.

SUMMARY OF CERTAIN INVENTIVE ASPECTS

The disclosure aims to provide a structure that does not suffer from the above disadvantages. This aim is achieved by a device and method as disclosed in the appended claims.

In one aspect, a diode includes a lower group III metal nitride layer and an upper group III metal nitride layer and a heterojunction formed therebetween, where the heterojunction extends horizontally and is configured to form a two-dimensional electron gas (2DEG) that is substantially confined in a vertical direction and within the lower group III metal nitride layer. The diode additionally includes a cathode forming an ohmic contact with the upper group III metal nitride layer. The diode additionally includes an anode, which includes a first portion that forms a Schottky barrier contact with the upper group III metal nitride layer, and a second portion that is separated vertically from the upper group III metal nitride layer by a layer of dielectric material. The anode is configured such that the second portion is horizontally located between the anode and the cathode and the dielectric material is configured to pinch off the 2DEG layer in a reverse biased configuration of the diode. The diode further includes a passivation area formed between the anode and the cathode to horizontally separate the anode and the cathode from each other.

In a device according to the disclosure, the layer of dielectric material separating the second anode portion from the upper group III metal nitride layer may have a thickness between 2 and 30 nm.

According to an embodiment, the lower group III metal nitride layer is a GaN layer, and the upper group III metal nitride layer is an AlGaN layer.

The layer of dielectric material may be a stack of dielectric layers. The layer of dielectric material or at least a first sublayer of the layer of dielectric material may be covering the surface of the upper group III metal nitride layer between the anode and the cathode.

According to an embodiment, the device of the disclosure comprises a passivation layer on and in contact with the upper group III metal nitride layer, the passivation layer covering the surface of the upper group III metal nitride layer between the anode and the cathode, wherein the layer of dielectric material comprises a first portion of the passivation layer and of a high-K dielectric layer on and in contact with the first portion of the passivation layer. The passivation layer may be a layer consisting essentially of or comprising Silicon nitride ($Si_3N_4$) and the high K dielectric layer may consist of or comprise $Al_2O_3$.

The anode may further comprise at least one field plate termination.

In another aspect, a method of fabricating a diode includes providing a substrate, where the substrate includes a stack having a lower group III metal nitride layer and an upper group III metal nitride layer and a heterojunction formed therebetween. The method additionally includes providing a dielectric layer on a surface of the upper group III metal nitride layer. The method additionally includes providing a passivation layer on the dielectric layer and etching a first opening in the passivation layer, and stopping on the dielectric layer. The method additionally includes etching a second opening within the boundaries of the first opening, through the dielectric layer, and stopping on the surface of the upper group III metal nitride layer, where the second opening is formed closer to one side of the first opening than to an opposite side of the first opening. The method additionally includes filling the first and second openings with a metal and patterning the metal to form an anode of the diode, where the anode comprises a first portion that forms a Schottky barrier where the upper group III metal nitride layer contacts the metal. The anode is further configured such that a portion of the dielectric layer on which etching the first opening has stopped forms a layer of dielectric material interposing a second portion of the anode and the upper group III metal nitride layer. The method further includes forming a cathode in electrical contact with the heterojunction.

According to an embodiment of the method of the disclosure, the step of depositing a dielectric layer or a stack of dielectric layers comprises depositing a first single dielectric layer, the first single dielectric layer is also referred herein as a portion of the passivation layer and wherein the method does comprise a step of conformally depositing a second single dielectric layer on the portion of the passivation layer and in the first opening.

According to an embodiment, the first single dielectric layer is a layer consisting essentially of or comprising silicon nitride, and the second single dielectric layer is a layer consisting essentially of or comprising $Al_2O_3$.

The steps of the method of the disclosure may be integrated with the steps of forming a HEMT device on the substrate, wherein a portion of the dielectric layer or the stack of dielectric layers, optionally further comprising one or more additional dielectric layers is used as the gate dielectric of the HEMT device, and wherein a portion of the metal layer is used as the gate metal of the HEMT device.

The disclosure is equally related to a semiconductor device comprising a Schottky diode according to the disclosure and a HEMT device, wherein:

the layer of dielectric material between the second portion of the anode and the upper group III metal nitride layer and the gate dielectric of the HEMT are mutually identical in terms of their thickness and composition. According to different embodiments, both the layer of dielectric material between the second portion of the anode and the upper group III metal nitride layer, and the gate dielectric of the HEMT consist of a first single dielectric layer and a second single dielectric layer on and in contact with the first single dielectric layer. The first single dielectric layer consists essentially of or comprises Silicon nitride (Si3N4) and the second dielectric layer consists essentially of or comprises a high-K material, in particular $Al_2O_3$.

DETAILED DESCRIPTION OF CERTAIN ILLUSTRATIVE EMBODIMENTS

Figure 1A:
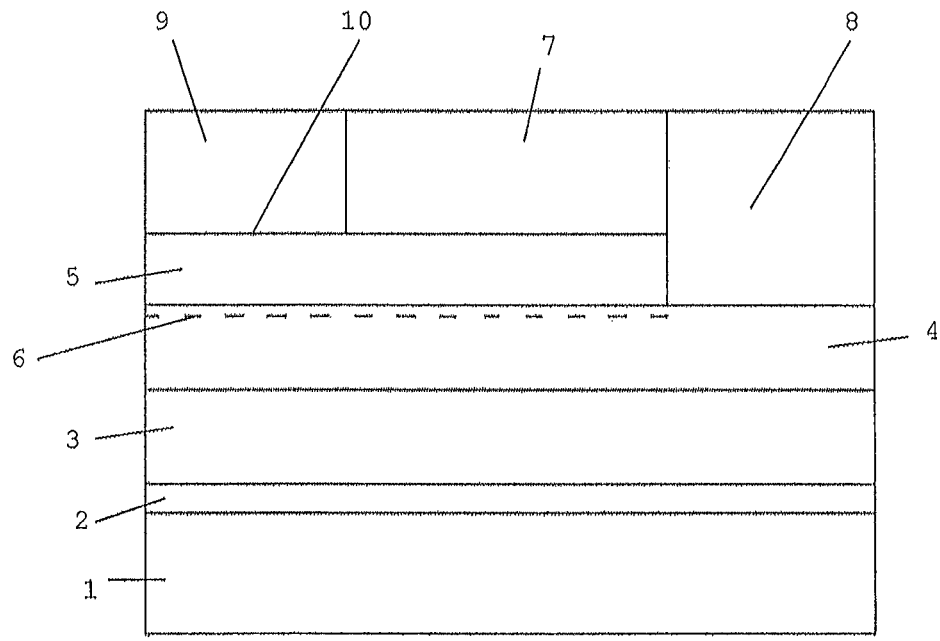
FIGS. 1a and 1b illustrate the structure of a Schottky diode device known in the art.
Figure 1B:
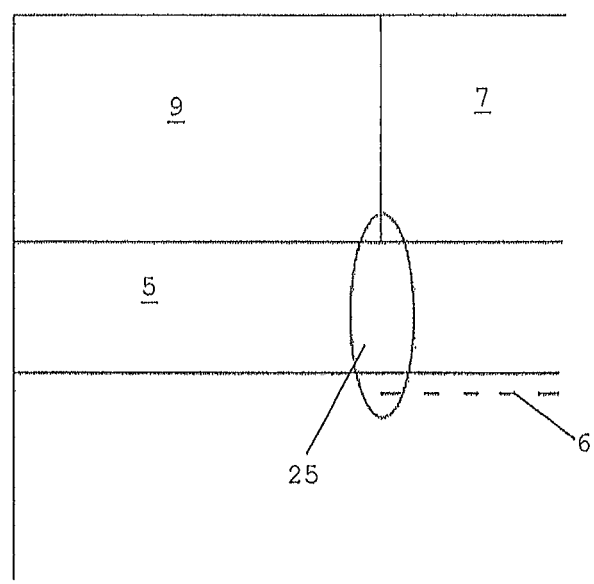

As a point of reference, the operation of a standard Schottky barrier diode is summarized hereafter, based on FIGS. 1a and 1b. FIG. 1a shows an AlGaN/GaN structure suitable for producing a diode, comprising:

Substrate 1: this is the carrier where the epitaxial layers are grown. It can be a silicon or a silicon carbide substrate for example.

Nucleation layer 2: to mitigate the mismatch between the substrate 1 and the buffer layer 3.

Buffer layer 3: Preferably this layer is constituted by several $Al_{1-x}Ga_xN$ layers with different aluminium content (x). It improves the buffer breakdown of the device, minimizes the mismatch between the substrate 1 and the GaN layer 4, and improves the confinement of the 2DEG at the AlGaN/GaN interface.

GaN channel layer 4: this is realized by the deposition of non-doped GaN. In this layer the channel for the conduction of the device is formed.

AlGaN barrier Layer 5.

2DEG 6 (two dimensional electron gas): this layer is the consequence of the growth of the AlGaN barrier layer 5 on top of the GaN channel layer 4. It is a gas of electrons with high density confined at the AlGaN/GaN interface. The carriers flow through this channel when the device is conducting current.

Passivation area 7: this may be one or a stack of dielectric layers deposited on the surface of the device. It improves the interface with the layers on top of it and prevents the action of impurities and external ambient factors to damage the device.

Cathode 8: this is preferably a stack of different metals selected in order to form a low-resistive ohmic contact with the AlGaN barrier 5.

Anode 9: this is a metal electrode that forms a Schottky contact 10 with the AlGaN layer 5.

Figure 2:
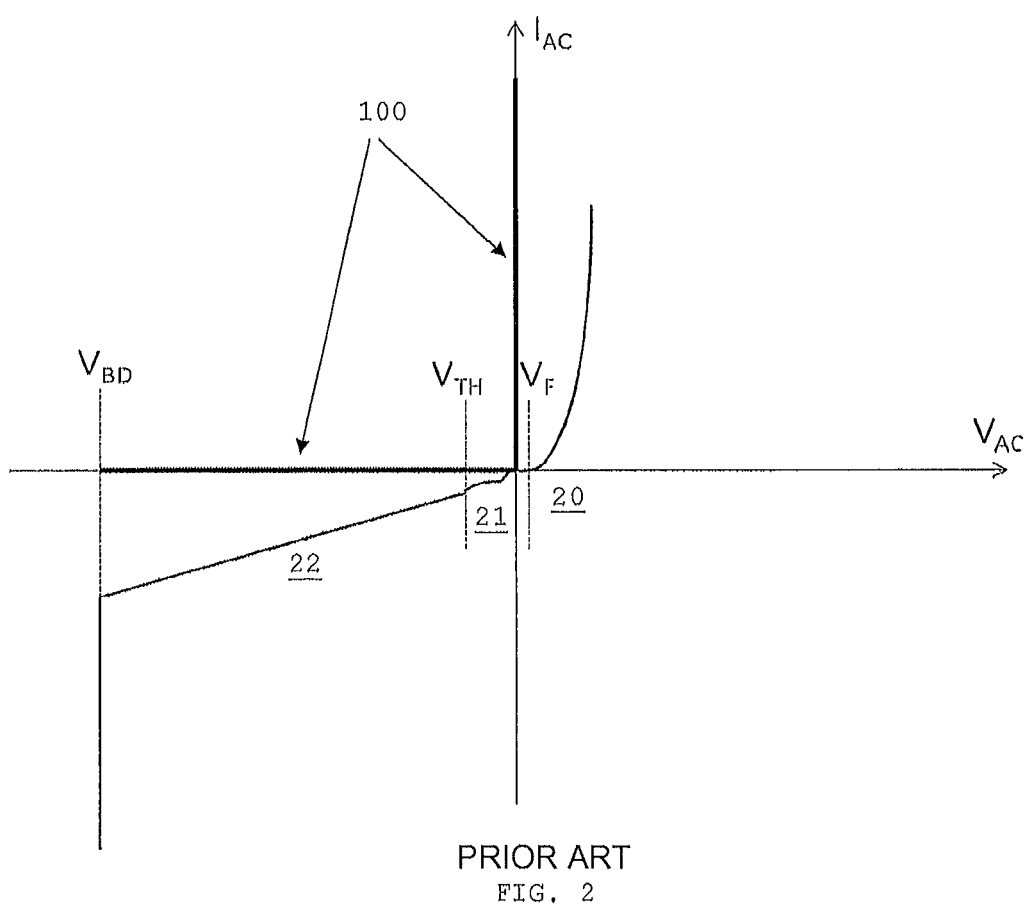
FIG. 2 illustrates the I-V characteristic of the prior art device of FIG. 1.

FIG. 1b shows a detail of the Schottky barrier region. The device operation is explained on the basis of the I-V characteristic shown in FIG. 2. At a sufficiently high positive voltage, region 20, the device operates in forward mode. Under these conditions, the diode conducts current, i.e. electrons are free to flow from the anode to the cathode through the channel formed by the 2DEG. Because of the high carrier mobility in the 2DEG, the characteristic approaches the vertical portion of the theoretical IV-characteristic 100 for an ideal device, i.e. high currents can be transported at low voltage drops over the diode. Forward conducting mode takes place above the turn-on voltage $V_F$, which depends on the height of the potential barrier of the anode-to-AlGaN Schottky contact 10.

The threshold voltage $V_{TH}$ is the voltage at which the 2DEG layer becomes depleted in the region underneath the anode. In the case illustrated in FIG. 2, $V_{TH}<0$. When this is the case, the device is commonly referred to as 'normally ON', i.e. when $V_{AC}$ is zero, the 2DEG is present and current can flow as soon as the voltage is sufficiently high to promote the crossing of the Schottky barrier by the electrons on the channel.

In reverse bias mode, i.e. for voltages lower than 0, the ideal characteristic 100 should also be approached as closely as possible. In the actual device, a leakage current appears however, as the negative voltage increases (in absolute value): in a first region 21 of the characteristic, the 2DEG underneath the Schottky contact area is not fully depleted, and a small leakage current appears, even when the Schottky barrier is fully in reverse bias, mainly caused by electrons that are crossing the barrier due to tunnelling effects for example. At the threshold voltage $V_{TH}$, the 2DEG is fully depleted, but at the edge of the Schottky region, in area 25 indicated in FIG. 1b, electrons are still leaking through to the anode. As the negative voltage $V_{AC}$ increases in absolute value, this leakage current increases linearly (region 22 in FIG. 2), with power losses as a consequence. At voltage $V_{BD}$, the device ultimately goes into reverse breakdown.

When $V_{TH}>0$ (normally OFF' device), the 2DEG is depleted when $V_{AC}$ equals zero, and no current can flow unless $V_{AC}$ exceeds both $V_{TH}$ and the height of the potential barrier of the Schottky junction. The turn-on voltage in this case is therefore determined by the higher of these two parameters ($V_{TH}$ and Schottky barrier potential). Below $V_{TH}$ and in reverse bias mode ($V_{AC}<0$), the normally OFF device will also suffer from a linearly increasing leakage current, as in the case of the normally ON device.

The device described in US2011/0133251 provides an improvement in terms of the leakage current, but still suffers from a number of drawbacks. Laterally with respect to the Schottky contact area in this device, and between the area and the cathode, the anode comprises a portion that is separated from the AlGaN layer by an insulating layer. A further field dielectric region is present between the Schottky contact area and the insulating layer. When the device goes into reverse breakdown mode, the insulating layer acts to pinch off the 2DEG in a depletion region, when the cathode reaches the pinch voltage of the insulating material. This effectively reduces the leakage current. The disadvantage of this structure lies in the large size of the anode which needs to span the width of the distance between the Schottky contact and the insulating layer, the distance including also the field dielectric in between the Schottky contact and the insulating layer. The presence of this field dielectric therefore increases the resistance in forward bias mode as well as the intrinsic capacitance of the device.

Figure 3A:
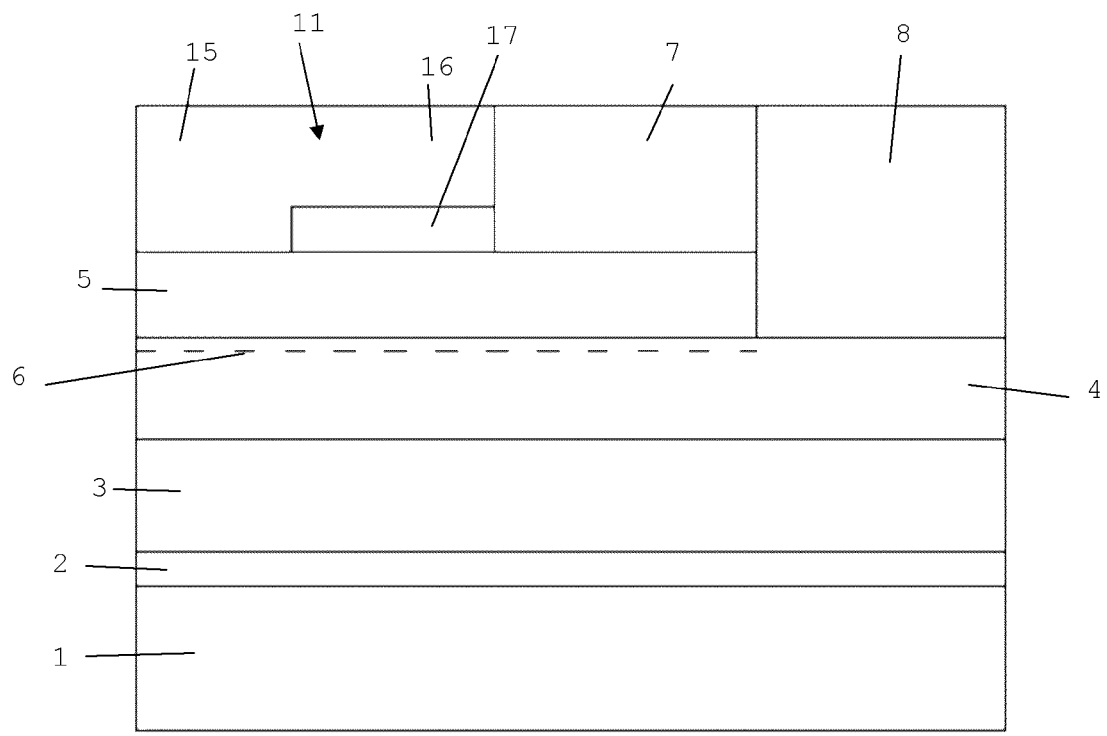
FIGS. 3a to 3c show the structure of a Schottky diode according to the disclosure.
Figure 3B:
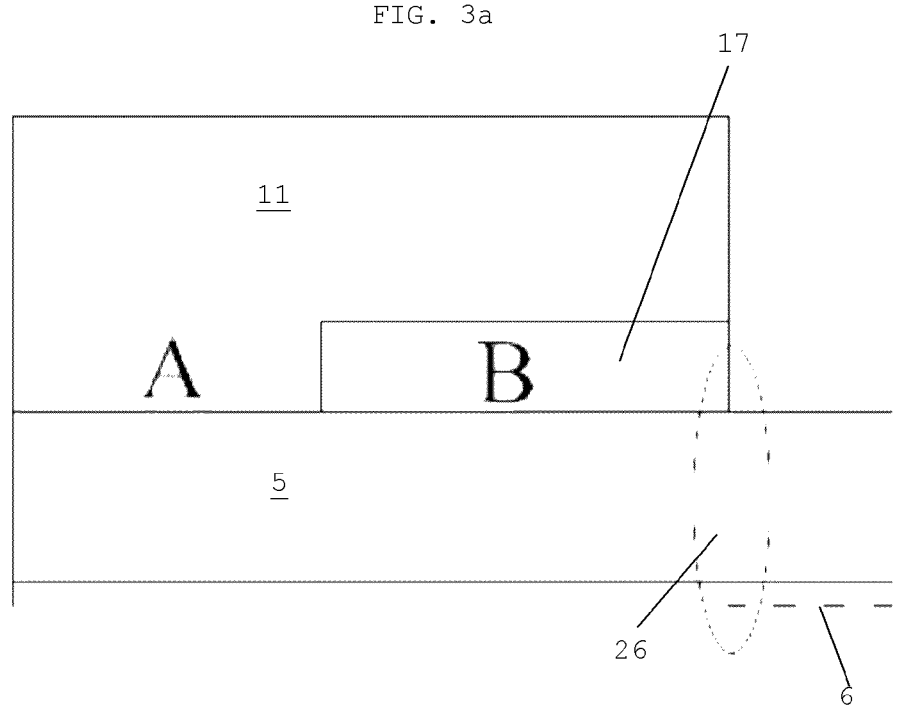

FIG. 3a shows a device according to an embodiment of the disclosure. The same reference numbers 1 through 8 are indicated, referring to the same components as described above for the standard device. Characteristically for the disclosure, the shape of the anode 11 is such that the anode comprises a first portion 15 in direct contact with the AlGaN layer 5 and a second portion 16, separated from the AlGaN layer 5 by a thin layer 17 of dielectric material situated between the anode and the cathode. The second portion 16 is thus an elongation of the anode, in the direction of the cathode, but separated from the underlying group III metal nitride layer by the dielectric layer 17. FIG. 3b shows a detail of the structure of FIG. 3a, wherein two regions A and B are indicated:

Region A is the contact region between the anode's first portion 15 and the AlGaN barrier layer 5. Through this area the current flows from the anode to the cathode when the Schottky diode is in forward bias mode. The surface area of this contact is one of the factors that determine the total amount of current passing into the device.

Region B is the contact region between the dielectric layer 17 and the AlGaN layer 5. It is the region situated underneath the elongation portion 16 of the anode extending over the anode-to-cathode region. This portion 16 of the anode is not in contact with the AlGaN barrier layer 5, but separated from it by the thin dielectric layer 17.

In the structure of the disclosure, portions 15 and 16 (and thus also regions A and B) are directly adjoining, in other words, they are not separated by another region on the surface of the upper group III metal nitride layer 5. This design ensures a minimization of the anode size, as well as of the forward bias mode resistance and the intrinsic capacitance. At the same time, the design ensures the pinching off effect in reverse bias mode in the region underneath the thin dielectric layer 17 so that the leakage current is reduced.

Figure 3C:
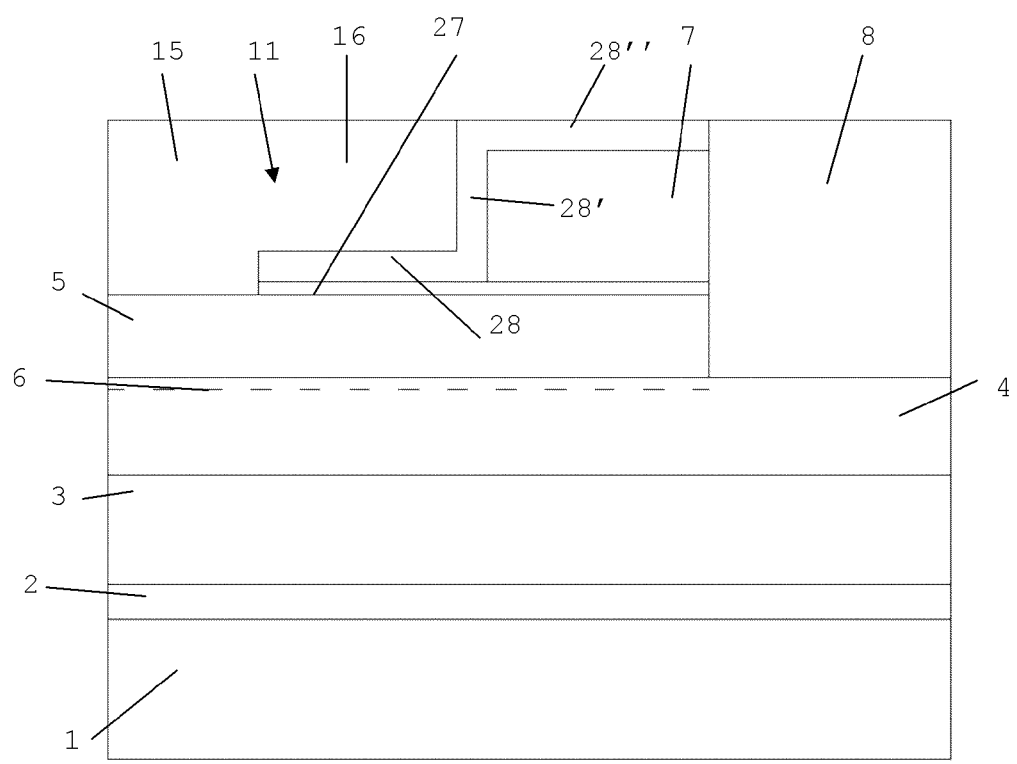

A specific embodiment of a diode structure according to the disclosure is shown in FIG. 3c. According to this embodiment, the thin dielectric layer 17 is formed by a stack of two dielectric layers 27 and 28. The lower 27 of the two layers is not only present in the area underneath the elongation portion 16, but covers the surface of the barrier layer 5 up to the cathode 8. The upper dielectric layer 28 further has a vertical portion 28' and a horizontal portion 28". A passivation layer 7' is present between the first dielectric layer 27 and the upper horizontal portion 28". In this way, the part of layer 27 extending outward from the elongation portion 16, together with the portions 28', 28" and 7' forms the passivation area 7 of the embodiment of FIG. 3a. This particular embodiment (FIG. 3c) is useful in that it allows an easy integration with the fabrication of a HEMT transistor, as illustrated further in this description. The lower dielectric layer 27 may be a passivation layer, such as a silicon nitride layer, deposited in-situ after deposition of the barrier layer 5. The upper dielectric may be a high K dielectric, such as an aluminium oxide layer. Any embodiment wherein the dielectric layer 17 is a bi-layer of layers 27 and 28 or a multilayer comprising multiple sublayers is within the scope of the disclosure, for example layer 28 may continue horizontally towards the cathode 8 (instead of along vertical and upper horizontal portions 28'/28").

Figure 4:
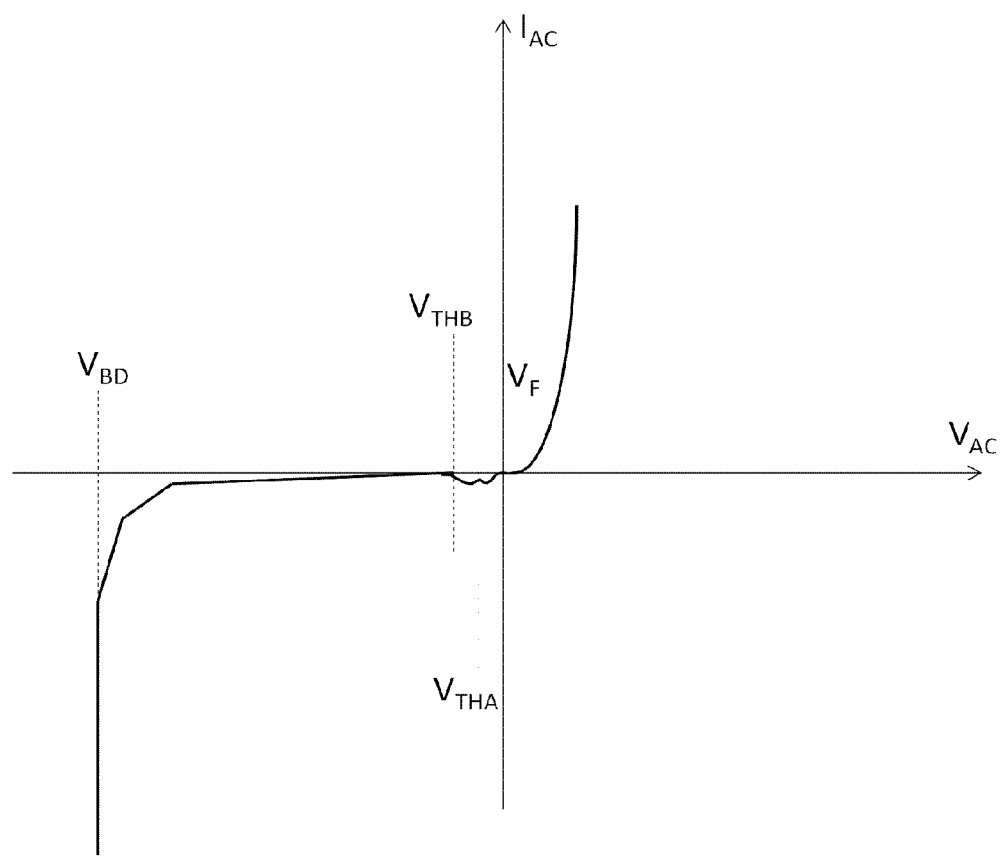
FIG. 4 shows the I-V characteristic of a device according to the disclosure.

The I-V characteristic in the case of $V_{TH}$<0 (normally ON' device) of a diode according to the disclosure is depicted in FIG. 4. As in the prior art device, the turn-ON voltage $V_F$ coincides with the Schottky contact barrier potential. Referring to the threshold voltage it is possible to distinguish a threshold voltage $V_{THA}$<0 related to the Schottky contact (region A) and a threshold voltage $V_{THB}$<0 related to the elongation region B. When the voltage across the device is negative (reverse blocking mode) but not sufficiently negative to be below one of the two threshold voltages, the channel is not fully depleted, carriers from the 2DEG can be attracted to the anode, thus the leakage current of the device is established by the Schottky barrier height in reverse polarization. When $V_{AC}$ is lower than $V_{THB}$ the channel area below region B is fully depleted, i.e. the channel area is pinched off. This ensures that substantially no leakage current appears, as the distance between edge area 26 and the anode is increased by the presence of the elongation 16. In this working region the leakage current is minimized by the effect of the anode elongation. In case of $V_{THB}$<$V_{THA}$<0 a small leakage current may still appear when $V_{THB}$<$V_{AC}$<$V_{THA}$. The real effect of blocking the gate leakage will appear only when $V_{AC}$<$V_{THB}$.

The reverse bias region of a diode according to the disclosure is defined as the range of voltages (between the anode and the cathode), the range being between $V_{BD}$ (reverse breakdown) and the threshold voltage $V_{THA}$ of the region A where the anode is in direct contact with the upper III nitride layer (layer 5 in the figures). In a diode of the disclosure, the 2DEG is pinched off by the depletion of the 2DEG in region B, in (i.e. in at least a portion of) the reverse bias region. The difference between $V_{THA}$ and $V_{THB}$ is preferably such that the 2DEG is pinched off in a substantial part (e.g. at least 50%) of the reverse bias region. The substantial part is preferably as large as possible, and depends mainly on the thickness and material of the thin dielectric layer 17. According to a preferred embodiment, the substantial part is at least 90% of the reverse bias region, more preferably at least 95%. According to a preferred embodiment, the layer of dielectric material 17 is as thin as possible, meaning:

it must be thick enough to ensure a complete separation of the anode and the upper group III metal nitride layer, so that no Schottky contact is present in region B (i.e. the region between the elongation portion 16 of the anode and the upper group III metal nitride layer 5), it must be thin enough so that the threshold voltage $V_{THB}$ is as close as possible to the threshold voltage $V_{THA}$ of the Schottky contact in region A.

Figure 5A:
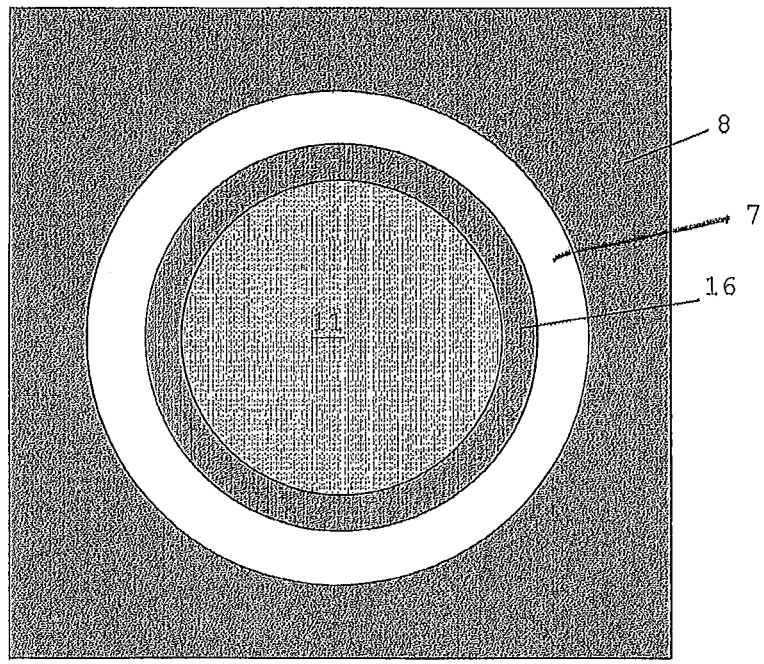
FIGS. 5a and 5b illustrate specific designs of device according to the disclosure.
Figure 5B:
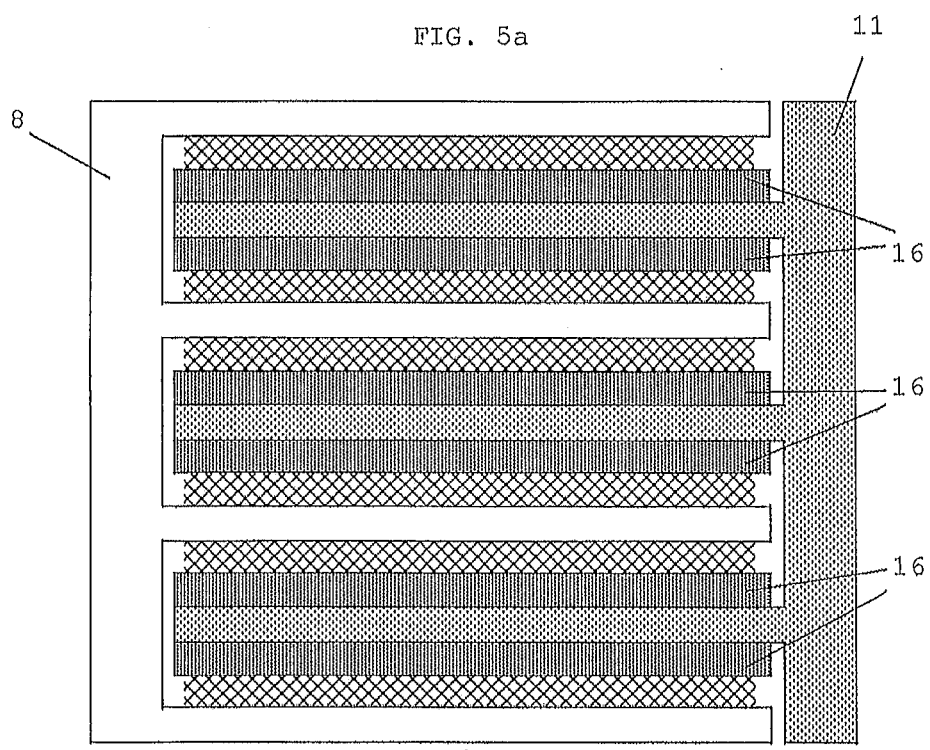

FIGS. 3a-3c show only a schematic representation of a device according to the disclosure. The basic concept is that at each side where the anode is facing the cathode, the anode electrode must be terminated with the over-elongation and the thin dielectric layer 17 underneath. The final shape of the device can be circular or multi-fingers, as illustrated in FIGS. 5a and 5b. The Numerals 8 and 11 indicate again the cathode and the anode respectively, numeral 16 indicates the location of the elongation portion(s) of the anode structure.

Figure 6:
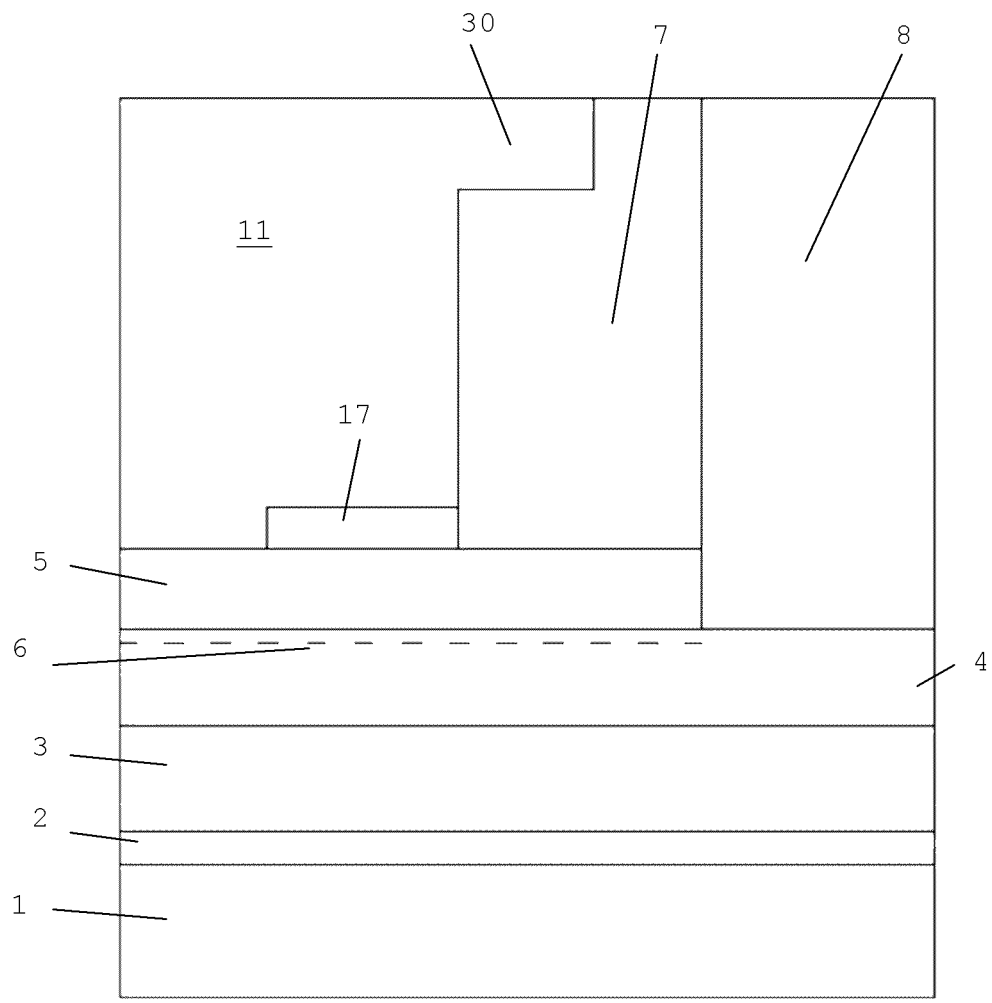
FIG. 6 illustrates a device according to the disclosure, further equipped with a field plate extension.

The thickness of the dielectric layer 17 (or combined thickness of layers 27 and 28) is small compared to the thickness of the passivation layer 7. Preferably, the layer 17 is between 2 nm and 30 nm thick. The elongation portion 16 of the anode is thereby distinguished from a so-called field plate termination of the anode, which is a lateral extension of the anode known in the art. Such a field plate is configured to lower the peak of the electric field at the edge of the anode facing the cathode electrode and thereby improve the breakdown of the device. Such extensions are applied at a much higher distance from the Schottky barrier contact interface 10. In other words, the thickness of a dielectric layer between a field plate termination and the Schottky barrier interface is significantly higher than the thickness of the dielectric layer 17 in a device of the disclosure. The field plate therefore cannot replace the elongation portion 16 since a significant pinch-off of the 2DEG cannot take place at voltages $V_{AC}$ that are within the reverse bias region. In other words, a pinch-off of the 2DEG can only be obtained at negative voltages that are essentially equal to or higher (in absolute value) than the reverse breakdown voltage $V_{BD}$. According to an embodiment of the disclosure, illustrated in FIG. 6, the anode is additionally equipped with at least one field plate 30 as known in the art.

A diode according to the disclosure can be produced by any suitable process, involving the deposition and patterning of layers on a stack of group III metal nitride layers (e.g. GaN/AlGaN) provided on a base substrate, preferably a silicon substrate. A preferred embodiment is described hereafter, according to which a diode is produced in an integrated process together with a HEMT device. The structure of the anode 11 in a diode of the disclosure is suitable for such integrated processes, given that the dielectric layer or stack of layers 17 can be produced by depositing one or more dielectric layers on a substrate and patterning the layer(s) in one patterning step to form simultaneously the dielectric 17 and the gate dielectric of the HEMT.

Figure 7A:
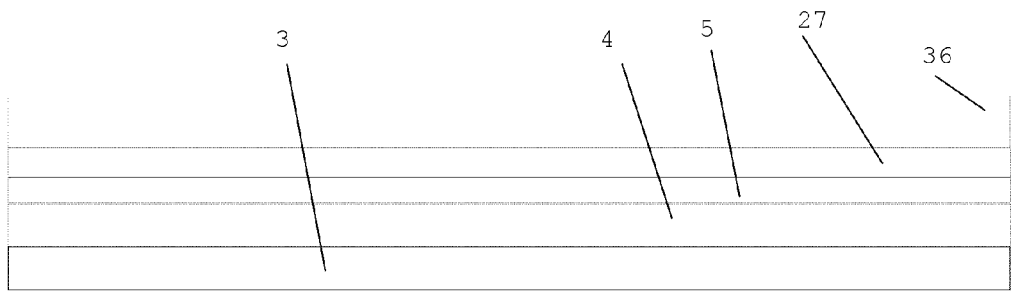
FIGS. 7a to 7g illustrate methods steps in an integrated process for producing a HEMT device and a Schottky diode according to the disclosure.
Figure 7B:
Figure 7C:

The steps of such an integrated process for forming a semiconductor device comprising a diode according to the disclosure and a HEMT transistor, are illustrated in FIGS. 7a to 7g. As seen in FIG. 7a: on a silicon substrate (not shown), a stack of layers is provided by epitaxial growth, similar to the ones shown in FIGS. 1 and 3, and comprising at least an AlGaN buffer layer 3, GaN channel layer 4 and AlGaN barrier layer 5. These layers may be grown for example by Metal Organic chemical vapour deposition (MOCVD) or Molecular Beam Epitaxy (MBE). A passivation layer 27 is then deposited by in-situ deposition on the AlGaN barrier layer 5, 'in situ' meaning that the passivation layer is deposited in the same process chamber as the layers 3/4/5 and by the same or equivalent process (e.g. MOCVD or MBE). Passivation layer 27 is preferably comprising or consisting essentially of silicon nitride ($Si_3Ni_4$ hereafter referred to as 'SiN'). This is followed by the deposition of a second passivation layer 36, deposited for example by LPCVD (low pressure chemical vapour deposition) at a temperature higher than 450° C. The second passivation layer may also be consisting essentially of or comprising silicon nitride.

A patterning step (using standard lithography) is performed for patterning the $2^{nd}$ passivation layer (FIG. 7b), forming openings 40 and 41 in the layer. This is done by etching the openings, stopping on the surface of the first passivation layer 27. Then a dielectric layer 28 is deposited conformal (FIG. 7c), i.e. following the contours of the topography defined by the openings 40 and 41. This can be a layer of $Al_2O_3$ of for example 10 nm on top of the LPCVD SiN layer 36 and on the sidewalls and bottom of the openings 40 and 41. The in-situ deposited passivation layer 27 and the dielectric layer 28 will function together as the gate dielectric of the HEMT device, and at the location of the Schottky diode, these same layers will function as the dielectric 17, as shown in the embodiment of FIG. 3c. The dielectric 28 may be a layer comprising or consisting essentially of $Al_2O_3$, deposited for example by ALD (Atomic Layer Deposition) at a temperature of about 400° C.

Figure 7D:
Figure 7E:
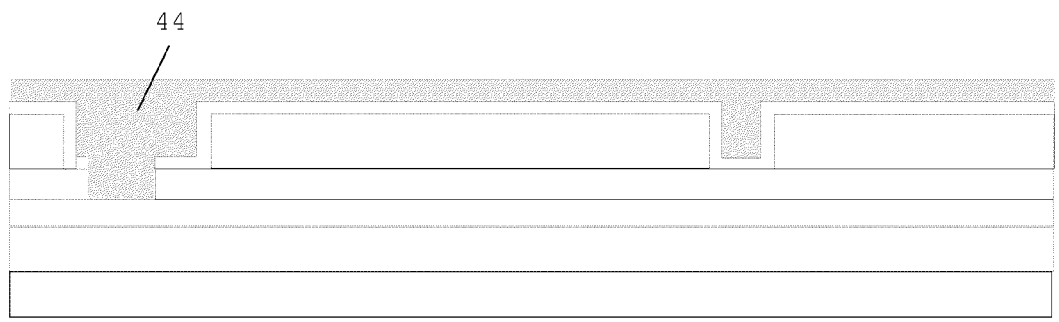
Figure 7F:
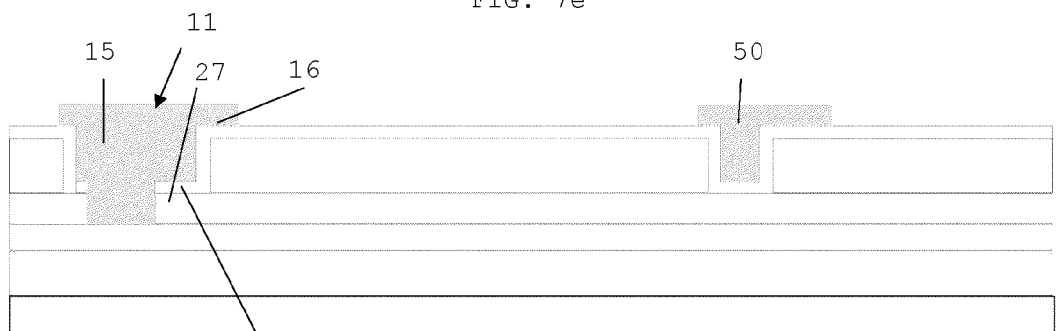
Figure 7G:
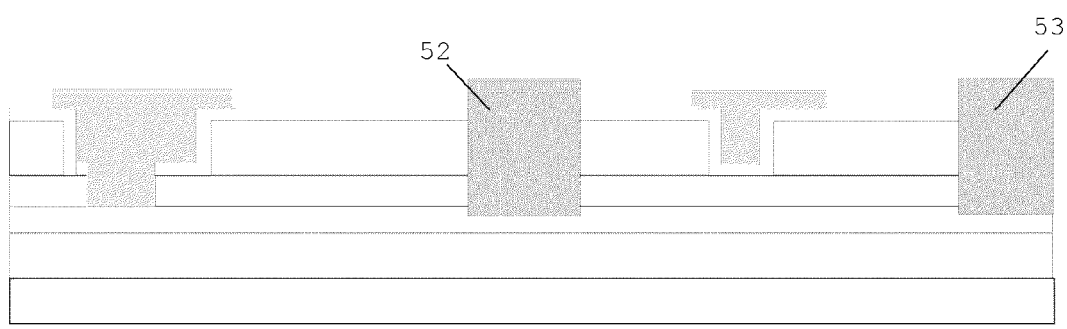
Figure 8:
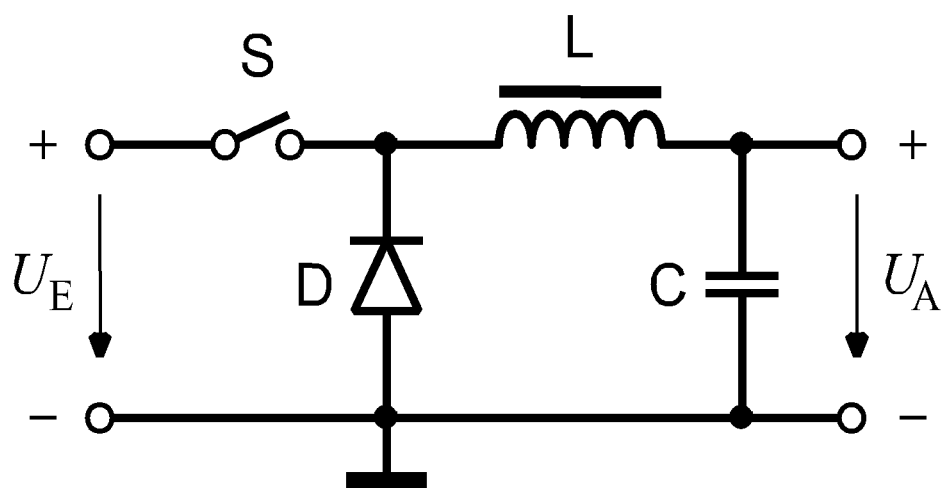
FIG. 8 illustrates a circuit that can be built using the structure produced by the method shown in FIGS. 7a to 7g.

A second patterning step is performed for forming a second opening within the boundaries of the first opening 40. The second opening is 43 is formed by etching through the stack of the passivation layer 27 and the dielectric layer 28, stopping on the surface of the barrier layer 5 (FIG. 7d). The second opening 43 is located closer to one edge of the first opening 40 than to the opposite edge of the first opening. Then (FIG. 7e) a metal deposition step is performed, filling the openings 43, 40 and 41 with metal 44 and forming a flat metal surface on top of the substrate. The metal will serve as the gate metal of the HEMT and the Schottky barrier metal of the diode. This metal layer 44 is further patterned (FIG. 7f) to form the gate 50 of a HEMT device and the anode 11 of a Schottky diode according to the disclosure. Because of the lateral location of the opening 43 inside the larger opening 40, the anode is shaped as in the previously described embodiments: having a Schottky contact portion 15 and an elongation portion 16, with a dielectric layer 17 underneath the elongation portion. The dielectric layer 17 here comprises or consists essentially of the stack of the in-situ deposited passivation layer 27 and the conformally deposited dielectric layer 28, i.e. the stack of $SiN/Al_2O_3$ according to a preferred embodiment. Then the source and drain contacts 52 and 53 of the HEMT device are created (FIG. 7g) by suitable further patterning and deposition steps. The source 52 of the HEMT transistor serves as the cathode 8 of the Schottky diode. This structure allows to produce the circuit illustrated in FIG. 8, where the HEMT and Schottky diode are indicated as switch S and diode D.

When leaving out all references to a HEMT device, the above method description discloses also a method for producing a Schottky diode as shown in FIG. 3c, i.e. without simultaneously producing a HEMT. Variations of the embodiment of FIG. 7 can be envisaged by the skilled person. For example, the step of depositing the conformal layer 28 may be regarded as optional (although in that case the layer 27 should preferably be produced in a different material and thickness). If this optional step is not performed, the dielectric 17 of the Schottky diode is formed by the single dielectric layer 27. In the latter embodiment, instead of a single dielectric layer 27, a stack of layers may be deposited.

While the invention has been illustrated and described in detail in the drawings and foregoing description, such illustration and description are to be considered illustrative or exemplary and not restrictive. Other variations to the disclosed embodiments can be understood and effected by those skilled in the art in practicing the claimed invention, from a study of the drawings, the disclosure and the appended claims.

The foregoing description details certain embodiments of the disclosure. It will be appreciated, however, that no matter how detailed the foregoing appears in text, the disclosure may be practiced in many ways, and is therefore not limited to the embodiments disclosed. It should be noted that the use of particular terminology when describing certain features or aspects of the disclosure should not be taken to imply that the terminology is being re-defined herein to be restricted to include any specific characteristics of the features or aspects of the disclosure with which that terminology is associated.

Unless specifically specified, the description of a layer being deposited or produced 'on' another layer or substrate, includes the options of the layer being produced or deposited directly on, i.e. in contact with, the other layer or substrate, and the layer being produced on one or a stack of intermediate layers between the layer and the other layer or substrate.

What is claimed is:

1. A Schottky diode device comprising:
    a lower group III metal nitride layer and an upper group III metal nitride layer and a heterojunction formed therebetween, wherein the heterojunction extends horizontally and is configured to form a two-dimensional electron gas (2DEG) that is substantially confined in a vertical direction and within the lower group III metal nitride layer;
    a cathode forming an Ohmic contact with the upper group III metal nitride layer;
    an anode comprising:
        a first portion that forms a Schottky barrier contact with a surface of the upper group III metal nitride layer; and
        a second portion that is separated vertically from the upper group III metal nitride layer by an interposed dielectric material that contacts the surface of the upper group III metal nitride layer at the same vertical level that the Schottky barrier contact contacts the surface of the upper group III metal nitride layer,
    wherein the second portion is horizontally located between the first portion of the anode and the cathode, and
    wherein the dielectric material comprises plurality of dielectric layers and is configured to pinch off the 2DEG layer in a reverse-biased configuration of the Schottky barrier contact; and
    a passivation layer formed between the anode and the cathode to horizontally separate the anode and the cathode from each other,
    wherein the dielectric material comprises a different material than the passivation layer,
    wherein the dielectric material comprises a lower dielectric layer that contacts the surface of upper group III metal nitride layer at the same vertical level that the Schottky barrier contact contacts the surface of the upper group III metal nitride layer, wherein the lower dielectric layer laterally extends to abut the cathode,
    wherein the dielectric material further comprises an upper dielectric layer vertically interposed between the lower dielectric layer and the second portion of the anode,
    wherein the upper dielectric layer laterally extends towards the cathode to cover a sidewall of the passivation layer and further extends to cover an upper surface of the passivation layer, such that the passivation layer is vertically interposed between the lower dielectric layer and the upper dielectric layer.

2. The device of claim 1, wherein the upper dielectric layer is formed of a high-K dielectric layer and the lower dielectric layer is formed of silicon nitride.

* * * * *